Oct. 25, 1955 A. L. HOPPER 2,721,980
OSCILLATOR SYSTEM
Filed March 2, 1953 2 Sheets-Sheet 1

INVENTOR
A. L. HOPPER
BY Hugh S. Wertz
ATTORNEY

Oct. 25, 1955

A. L. HOPPER

OSCILLATOR SYSTEM 2,721,980

Filed March 2, 1953

2 Sheets-Sheet 2

INVENTOR
A. L. HOPPER
BY Hugh S. Wertz
ATTORNEY

United States Patent Office 2,721,980

Patented Oct. 25, 1955

2,721,980

OSCILLATOR SYSTEM

Andrew L. Hopper, Summit, N. J., assignor to Bell Telephone Laboratories, Incorporated, New York, N. Y., a corporation of New York

Application March 2, 1953, Serial No. 339,583

11 Claims. (Cl. 332—23)

This invention relates to oscillator systems and more particularly to high frequency oscillator systems.

An object of this invention is to provide an improved high frequency oscillator whose frequency may be varied continuously over a wide range.

Another object is to provide an improved microwave frequency-modulation system.

A further object is to provide a microwave transmission circuit whose electrical length is constant over a wide range of frequencies.

In recent years the development of broad band microwave transmission has resulted in the need for oscillator systems capable of utilizing the newly available band width. At frequencies for which oscillators have formerly been built, a conventional feedback loop, by which oscillation sustaining energy is returned to the input of the oscillator, has an electrical length that is generally small in comparison with the wavelength of oscillations. Consequently the change in phase shift of the loop for a change in frequency is small and does not very seriously restrict the percentage band width of low frequency systems. At microwave frequencies, on the other hand, where a wave guiding circuit may be many wavelengths long, oscillator systems employing previously known feedback loops are limited by the length of these loops to undesirably small band widths over which the frequency may be continuously varied. Another object, therefore, of the present invention is to provide a circuit, which may be used as an energy circulating loop in microwave oscillators, which although of appreciable electrical length is nonetheless substantially constant in length over a wide range of frequencies.

In accordance with one aspect of the present invention, a wide-band microwave amplifier, which may, for example, be a traveling wave tube, is arranged for use as a frequency variable oscillator by connecting a portion of the output energy from this amplifier to the input thereof by a feedback circuit including a reference source of variable frequency and first and second frequency converters. By proper choice of the electrical lengths of the various transmission paths employed in this arrangement the net length of the energy circulating loop from the input of the wide-band amplifier around again to the input thereof can be made substantially independent of frequency over an appreciable range. A more complete understanding, however, of the details of such an arrangement, together with a better appreciation of the nature and objects of this invention, will best be gained from a study of the following detailed description thereof given in connection with the accompanying drawings.

Referring to the drawings in general:

Figure 1:
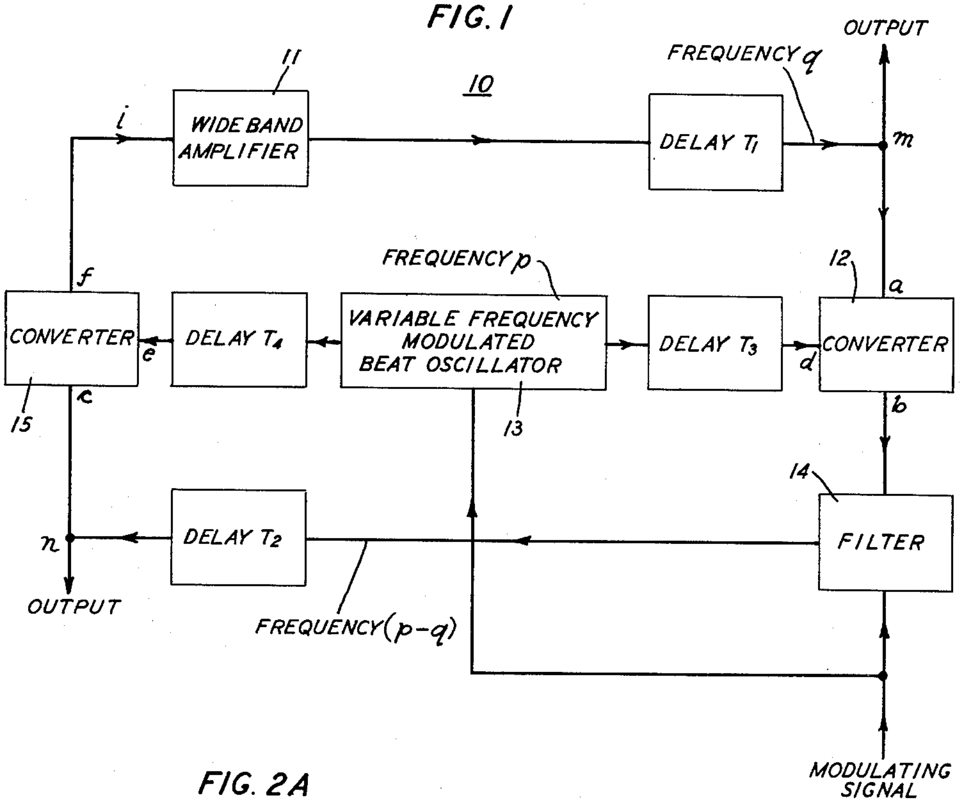
Fig. 1 is a block schematic diagram of a frequency variable oscillator system.

Referring now more particularly to the drawings, Fig. 1 shows, by way of example, a block diagram of an oscillator arrangement 10 in which a frequency modulated oscillator 13, which may be of the reflex type, is the primary source of high frequency energy. It will be convenient however, for purpose of explanation, to consider the oscillator arrangement by starting with wide-band amplifier 11, which is shown in branch *fa* and may be a traveling wave tube. An amplified signal having a frequency $q$ is supplied from this amplifier to terminal $a$ of frequency converter 12. The total delay, or electrical length of the circuit from the input of amplifier 11 to terminal $a$ of this first frequency converter, is represented by delay $T_1$. The second input terminal $d$, of converter 12 is connected by a wave guiding circuit having a delay $T_3$ to the frequency modulated oscillator or reference frequency source 13, which supplies to this terminal a signal having a variable frequency $p$. This oscillator signal together with the wide-band amplifier signal produces a signal having a frequency $(p-q)$ at output terminal $b$ of the converter.

Filter 14, which is connected to terminal $b$ of converter 12, is adjusted by means of a modulating signal to pass only a particular frequency $(p-q)$. It is, of course, understood that the frequency $(p-q)$ to which filter 14 is tuned will vary with time since frequency $p$ varies with time. Such variation in tuning of the filter is accomplished in accordance with variations in the applied modulating signal as will be explained hereinafter. Frequencies lying outside the pass band of this filter are thus prevented from reaching the input terminal $c$ of converter 15. This filter is shown in loop *bc* in Fig. 1 merely by way of example and if desired an equivalent element, such as a narrow band adjustable frequency amplifier may be substituted for it at any convenient point in circuit branches *bc* or *fa*.

A wave guiding circuit such as a coaxial cable or a conductively bounded wave guide having a total delay, including the delay of filter 14, represented by delay $T_2$, may be used to lead the signal from terminal $b$ of converter 12 through filter 14 to terminal $c$ of converter 15. The signal applied to terminal $c$ of this second converter is heterodyned with a signal which is applied to terminal $e$ by a wave guiding circuit, having a delay represented by delay $T_4$ connecting terminal $e$ with oscillator 13 to produce a signal having a frequency $q$ at terminal $f$. By proper choice of the circuit parameters in the energy circulating loop from the input terminal $i$ of amplifier 11 through the first and second converters to terminal $f$ of the second converter the amplitude of the signal at terminal $f$ may be made substantially equal to the signal input to amplifier 11, it being assumed for the purpose of analysis that the terminals $f$ and $i$ are unconnected and each terminal terminated in the impedance it will encounter when connected. Moreover, the phase shift between the two signals present at the two unconnected terminals $f$ and $i$ will automatically remain substantially constant over a wide range of frequencies. When these conditions are satisfied, oscillation of electrical energy in the circuit will occur if terminal $f$ is connected to the input terminal $i$ of amplifier 11.

The frequency $q$ at which amplifier 11 operates is determined by frequency $p$ of oscillator 13 and by frequency $(p-q)$ which is fixed by filter 14. A modulating signal which simultaneously varies the frequency of this oscillator and the resonant frequency of filter 14 appropriately may be used to modulate frequency $q$.

Amplitude feedback to stabilize the operation of the circuit may easily be provided if desired by applying for example a rectified portion of the output of amplifier 11 as a biasing voltage to the non-linear conducting element of one of the converters. In this or a similar way, any tendency of the circuit to overload may be repressed.

An output signal having a frequency $q$ may be obtained at point $m$ indicated in Fig. 1 and a signal of frequency $(p-q)$ may be obtained at point $n$ as shown. The energy which is available at these points is of course dependent upon the net energy supplied to the system by the active elements thereof.

The effect of the electrical lengths $T_1$, $T_2$, $T_3$, and $T_4$ upon the operation of the circuit shown in Fig. 1 may best be understood by the following short mathematical analysis. Designating the phase angle $\phi$ of the voltage at a terminal in the circuit by a subscript corresponding to the terminal reference letter, the total phase shift in voltage from the input of amplifier 11 around again to the input thereof may be written as follows:

At terminal $i$ $\phi_i=qt$

At terminal $a$ $\phi_a=q(t-T_1)$

At terminal $d$ $\phi_d=pt-\theta_3$ (where $\theta_3$ is the phase shift due to delay $T_3$)

At terminal $b$ $\phi_b=pt-q(t-T_1)-\theta_3$

At terminal $c$ $\phi_c=p(t-T_2)-q(t-T_1-T_2)-\theta_3$

At terminal $e$ $\phi_e=pt-\theta_4$ (where $\theta_4$ is the phase shift due to delay $T_4$)

At terminal $f$ $\phi_f=pt+pT_2+qt-qT_1-qT_2-pt+\theta_3-\theta_4$ $$\phi_f-\phi_i=pT_2-qT_1-qT_2+\theta_3-\theta_4$$

To satisfy the condition for oscillation, $\phi_f-\phi_i$ must equal $2\pi n$ where $n=0, 1, 2$, but $$\theta_3=pT_3+\theta_0$$
$$\theta_4=pT_4+\theta_0$$

where $\theta_0$ is an arbitrary phase angle equal to the difference in phase between the curve representing the oscillations of source 13 at frequency $p$ and the curve representing the signal at frequency $q$ which passes through branch $fa$ Therefore:

$$pT_2-pT_4-\theta_0-qT_1-qT_2+pT_3+\theta_0=2\pi n$$

Assuming $T_1$, $T_2$, $T_3$, and $T_4$ are constant the derivative of the preceding equation is:

$$T_2dp-T_4dp-T_1dq-T_2dq+T_3dp=0$$

and $$\frac{dq}{dp}=\frac{T_3-T_4+T_2}{T_1+T_2} \quad (1)$$

if $T_2$ and $T_4$ are made small compared to $T_1$ and $T_3$ then $$\frac{dq}{dp}=\frac{T_3}{T_1} \quad (2)$$

Equation 1 says that for infinitesimal changes $dq$ in frequency $q$ and $dp$ in frequency $p$, the ratio of these changes equals a specified ratio of electrical lengths $T_1$, $T_2$, $T_3$, and $T_4$. For larger changes $\Delta q$ in frequency $q$ and $\Delta p$ in frequency $p$ this equation still applies provided changes $\Delta q$ and $\Delta p$ are small relative to frequencies $q$ and $p$ respectively.

In an oscillator circuit substantially the same as that shown in Fig. 1, which has been built and tested, frequencies of 4, 6, and 10 thousand megacycles were used and a deviation of approximately 500 mc. at 4000 mc. was obtained. While these figures serve to illustrate the practical nature of the present invention they are not intended to imply that this invention is limited to any particular frequencies of operation or to any particular frequency band width.

It is evident that amplifier 11 in the above circuit may be removed from branch $fa$ in which it is shown in Fig. 1 and inserted in branch $cb$ therein. It is also possible in altering the circuit of Fig. 1 to insert amplifier 11 in branch $ed$ or to omit it from the circuit altogether but whether either of these alternatives is practical depends upon the losses of the actual circuit used.

An inspection of Fig. 1 reveals that both converters as shown there operate to provide an output frequency which is the difference of the two input frequencies. This operation of the converters produces a positive change in frequency $q$ for a positive change in $p$ for the conditions specified in connection with Equation 2. If a negative deviation ratio $\Delta q/\Delta p$ is desired, delay $T_3$ may be made negligible and delay $T_4$ then made long relative to delay $T_1$. To obtain a positive deviation ratio when delay $T_4$ is long and $T_3$ is negligible, converter 12, along with the other circuit elements, may be adjusted to provide a frequency $(p+q)$ in branch $bc$.

By making delays $T_2$ and $T_4$ small enough compared to $T_1$ and $T_3$ equal to $T_1$ in Fig. 1 frequency $(p-q)$ can be made substantially constant even though frequency $p$ varies and in this way a frequency stabilized oscillator may be obtained. Lastly, it should be noted in connection with Fig. 1 and with Equation 1 that the frequency deviation $\Delta p$ of oscillator 13 may be multiplied by a number which is not necessarily an integer.

Figure 2A:
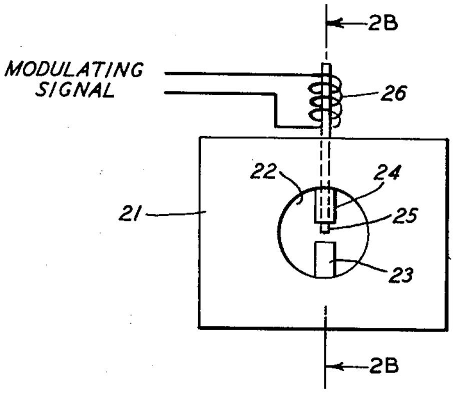
Figs. 2A and 2B are a front view and a side section view respectively of a resonant wave guide filter, or iris, which may be used in the oscillator system of Fig. 1.
Figure 2B:
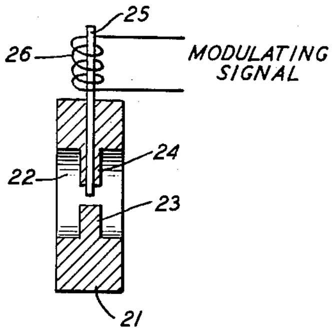

Figs. 2*A* and 2*B* give, for the purposes of illustration, front and section views, respectively of a frequency determining element which may be used in a conductively bounded wave guide to perform the functions of filter 14 in Fig. 1. A conductive plate 21, apertured in the iris 22, is designed to be connected across a rectangular wave guide thereby forming a frequency filter. Extending into the iris in the plate are two conductive posts 23 and 24 which together with the iris form a resonant circuit. Within the post 24, there extends a conductive plunger 25 which may be varied up and down by the action of the magnetic fields set up in the surrounding solenoidal coil 26 by modulating signals applied thereto. Plunger motion effects a change in the separation between the conductive posts 23 and 24 and hence the resonant frequency of the iris. It is to be understood, however, that filter 14 shown in Fig. 1 is not restricted to the structure shown in Figs. 2*A* and 2*B* but may be any suitable device.

Figure 3:
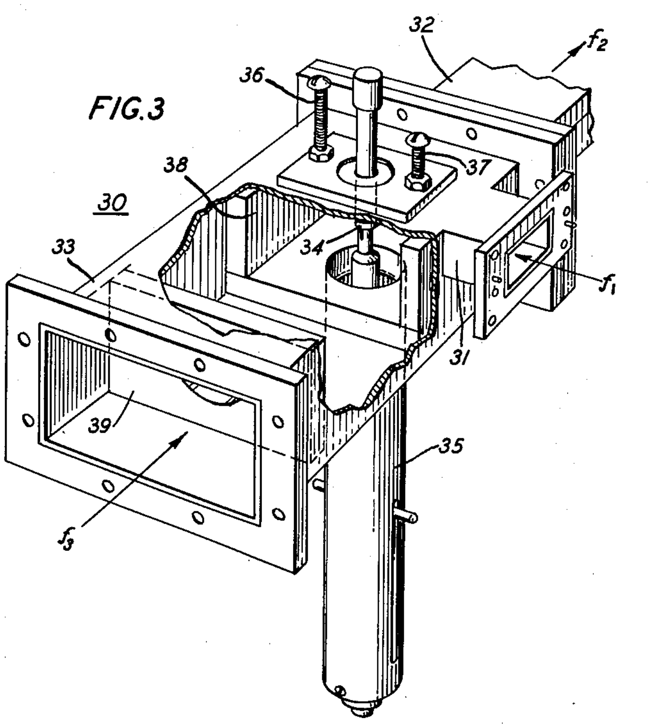
Fig. 3 shows in perspective a wave guide frequency converter which may be used in the oscillator system of Fig. 1.
Figure 4:
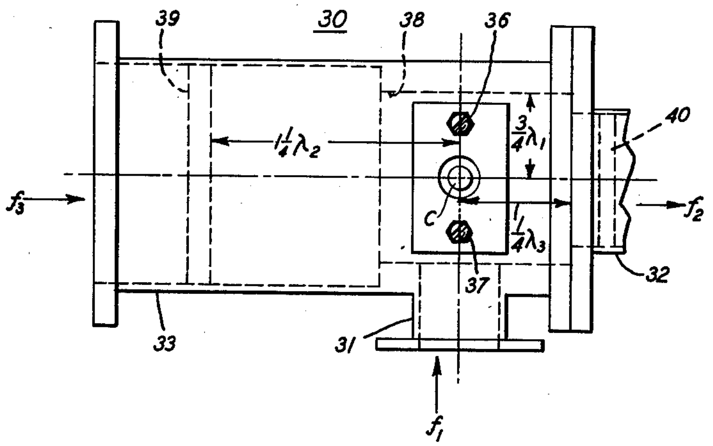
Fig. 4 is the top view of the frequency converter shown in Fig. 3.

Figs. 3 and 4 show in elevation and plan views respectively a frequency converter for use with rectangular wave guides which will perform the function of converters 12 and 15 in Fig. 1. The converter shown in Figs. 3 and 4 consists of a shunt T junction 30 of three intersecting wave guides 31, 32, and 33. The inside dimensions, chosen according to formulae well known to the art and which will not be given here, of each of these guides are such that each propagates a wave in the fundamental transverse electric mode at a respective one of the frequencies $f_1$, $f_2$, and $f_3$ as indicated in the drawings. Power flow into and out of the junction 30 is indicated by arrows pointing in the direction of power flow. These directions, however, are not unique. On the contrary, because of the reciprocal nature of the converter power may flow out of the converter through any one of the three branches, provided only that sufficient power flows into the remaining two. It should be noted that this feature of the structure shown makes possible its use without modification for either converter 12 or converter 15 in the circuit of Fig. 1.

The intersection of the lines of center of the guides 31, 32, and 33, which is designated C in Fig. 4, is preferably the location of a non-linear conducting element, which may for example be a crystal diode 34, shown in Fig. 3 but not shown in Fig. 4, positioned so that it conducts current in a direction parallel to the electric field. A tuning stub 35, shown in Fig. 3 but not shown in Fig. 4, provides a convenient means for optimizing the current flowing through the non-linear conducting element but is not otherwise essential to operation. Tuning screws 36 and 37 shown in both Figs. 3 and 4 provide an effective way of eliminating spurious resonances within the junction cavity and should be adjusted accordingly. In addition they also provide a certain increase in converter efficiency. They are positioned on the center line of guide 31 approximately one-half $\lambda_1$ on either side of the center lines of guides 32 and 33.

Within the junction and perpendicular to the center line of guide 31 a conducting surface 38 is positioned so that a wave entering the junction via guide 31 will be reflected in phase with itself at point C. To this end, surface 38 is spaced an odd number of quarter wavelengths of $\lambda_1$, three-quarters $\lambda_1$ shown, from point C. The inside height of surface 38 is not critical but a value roughly three-quarters $\lambda_1$ has been found satisfactory. A wave reflecting element 39 is located in guide 33 opposite guide 32 an odd number of quarter wavelengths of $\lambda_2$ from point C, one and one-quarter $\lambda_2$ shown, for a similar reason. This wave reflecting element may be of any suitable structure such as the resonant iris shown in Figs. 2A and 2B, but it must be adjusted to pass a frequency $f_3$. The junction of guide 32 with the T cavity is made an odd number of quarter wavelengths of $\lambda_3$ distant from point C, one-quarter $\lambda_3$ shown, again for the same reason.

In general it is advantageous to insert frequency restrictive elements in certain arms of the T junction in order to suppress undesirable feed-through of power from one arm to another. It is not usually necessary, however, to insert a filter in every arm of the junction since the natural lower cut-off frequency of one arm is ordinarily high enough to suppress unwanted frequencies therein. This arm, in the structure illustrated, would correspond to guide 31. In order to prevent frequency $f_1$ from feeding through into the other two arms, frequency filters may be used such as wave reflecting element 39 in guide 33, and filter 40 shown positioned in guide 32. This latter filter should be adjusted to pass only frequency $f_2$ but it may be otherwise substantially the same as element 39.

The embodiment shown in Figs. 3 and 4 is only one possible structure which can be used as a converter in the circuit of Fig. 1 and has been illustrated here merely for completeness. The invention disclosed herein and illustrated in Fig. 1 is in no way limited to the use of this structure. In addition to the modifications of the circuit shown in Fig. 1 which have been mentioned in the foregoing, other changes or rearrangements will occur to those skilled in the art and may be made without departing from the spirit or scope of this invention.

What is claimed is:

1. In an oscillator system, amplifying means having a finite electrical length and having an input and an output terminal, and a feedback loop including a first frequency changing means connected to said output terminal, a second frequency changing means connected to said first frequency changing means, a frequency source connected to said first frequency changing means, means connecting said source to said second frequency changing means and having an electrical length long relative to the electrical length of said amplifying means, means connecting said second frequency changing means to said input terminal and supplying sufficient energy to said input terminal to maintain oscillations through said amplifying means and feedback loop, and means inserted in the path of energy flow in said oscillation system for determining the frequency of oscillations.

2. An oscillator system, including first frequency converting means, second frequency converting means, a source of variable frequency signals, first wave transmission means supplying energy from said first to second converting means second wave transmission means supplying energy from said second to said first converting means, wave transmission means connecting said signal source and said first converting means, wave transmission means connecting said signal source and said second converting means, and means inserted in the path of energy flow through said first and second wave transmission means for determining the frequencies of said energy, the loop gain around said first and second wave transmission means being greater than one.

3. The combination of elements as in claim 2 in which first wave transmission means includes an amplifier of wave energy.

4. The combination of elements as in claim 2 in which the second wave transmission means connecting said first and second converting means has an electrical length at the frequency of operation that is substantially zero.

5. The combination of elements as in claim 2 in which the wave transmission means connecting said signal source and said first converting means has an electrical length at the frequency of operation that is substantially zero.

6. The combination of elements as in claim 2 in which at the frequency of operation the wave transmission means connecting said signal source and said first converting means has an electrical length that is long relative to each of the electrical lengths of the first and the second wave transmission means.

7. A frequency stabilized oscillator including first converting means, second converting means, a source of variable frequency signals, first and second wave transmission means having electrical lengths $T_1$ and $T_2$ respectively, length $T_2$ being very small relative to length $T_1$, each of said wave transmission means interconnecting said first and second converting means, wave transmission means connecting said signal source and said first converting means having an electrical length that is substantially equal to $T_1$, and wave transmission means connecting said signal source and said second converting means having an electrical length that is very small relative to length $T_1$.

8. A microwave device including first frequency converting means, a variable reference frequency source having a frequency $p$, means having an electrical length $T_3$ and supplying signal energy from said reference frequency source to said first converting means, second frequency converting means, means having an electrical length $T_2$ and supplying signal energy from said first converting means to said second converting means, means having an electrical length $T_4$ and supplying signal energy from said reference frequency source to said second converting means, means having an electrical length $T_1$ and supplying signal energy from said second converting means to said first converting means, characterized in that the loop gain from the input of said first converting means around the closed loop including said first and second converting means and said means having an electrical length $T_1$ back to the input of said first converting means is substantially equal to unity and further that the frequency of the signal energy supplied through said means having an electrical length $T_1$ is $q$ and in that the ratio of the frequency deviation $\Delta q$ in frequency $q$ to the frequency deviation $\Delta p$ in frequency $p$ is determined by $T_1$, $T_2$, $T_3$, and $T_4$, the specified electrical lengths, and means for controlling the frequency of said signal energy supplied from said second converting means to said first converting means.

9. A microwave device including first frequency converting means, a variable reference frequency source having a frequency $p$, means having an electrical length $T_3$ and supplying signal energy from said reference frequency source to said first converting means, second frequency converting means, means having an electrical length $T_2$ and supplying signal energy from said first converting means to said second converting means, means having an electrical length $T_4$ and supplying signal energy from said reference frequency source to said second converting means, means having an electrical length $T_1$ and supplying signal energy from said second converting means to said first converting means, and means for controlling the frequency of said signal energy supplied from said second converting means, said means for controlling the frequency including a narrow band-pass frequency filter.

10. The combination of elements as in claim 8 in further combination with means for modulating the frequencies in said closed loop in accordance with a signal.

11. The combination of elements as in claim 8 in which length $T_3$ is long relative to lengths $T_1$, $T_2$, and $T_4$.

References Cited in the file of this patent

UNITED STATES PATENTS

| | | |
|---|---|---|
| 2,344,813 | Goldstine | Mar. 21, 1944 |
| 2,369,268 | Trevor | Feb. 13, 1945 |
| 2,407,212 | Tunick | Sept. 3, 1946 |
| 2,470,892 | Hepp | May 24, 1949 |